US011908889B2

(12) United States Patent
Gong et al.

(10) Patent No.: US 11,908,889 B2
(45) Date of Patent: Feb. 20, 2024

(54) SEMICONDUCTOR SUPER-JUNCTION POWER DEVICE

(71) Applicant: SUZHOU ORIENTAL SEMICONDUCTOR CO., LTD., Suzhou (CN)

(72) Inventors: Yi Gong, Jiangsu (CN); Wei Liu, Jiangsu (CN); Yuanlin Yuan, Jiangsu (CN); Lei Liu, Jiangsu (CN); Rui Wang, Jiangsu (CN)

(73) Assignee: SUZHOU ORIENTAL SEMICONDUCTOR CO., LTD., Jiangsu (CN)

( * ) Notice: Subject to any disclaimer, the term of this patent is extended or adjusted under 35 U.S.C. 154(b) by 110 days.

(21) Appl. No.: 17/428,137

(22) PCT Filed: Dec. 5, 2019

(86) PCT No.: PCT/CN2019/123313
§ 371 (c)(1),
(2) Date: Aug. 3, 2021

(87) PCT Pub. No.: WO2021/103092
PCT Pub. Date: Jun. 3, 2021

(65) Prior Publication Data
US 2022/0285486 A1    Sep. 8, 2022

(30) Foreign Application Priority Data

Nov. 27, 2019  (CN) .......................... 201911184048.1

(51) Int. Cl.
H01L 29/06     (2006.01)
H01L 27/06     (2006.01)
(Continued)

(52) U.S. Cl.
CPC ...... *H01L 29/0634* (2013.01); *H01L 27/0629* (2013.01); *H01L 29/788* (2013.01)

(58) Field of Classification Search
CPC .............. H01L 29/0634; H01L 29/788; H01L 29/7804; H01L 29/42324; H01L 29/66462;
(Continued)

(56) References Cited

U.S. PATENT DOCUMENTS

2004/0032762 A1* 2/2004 Blanchard ........... H01L 29/7813
257/E21.422
2007/0187718 A1* 8/2007 Suzuki ............. H01L 29/66462
257/E29.253
(Continued)

FOREIGN PATENT DOCUMENTS

CN    102270663    12/2011
CN    103247626    8/2013
(Continued)

OTHER PUBLICATIONS

Wang et al., "A Semi-Floating Gate Transistor for Low-Voltage Ultrafast Memory and Sensing Operation", Science341,640-643 (Year: 2013).*
(Continued)

Primary Examiner — Alia Sabur
Assistant Examiner — David Gonzalez Alcantara
(74) Attorney, Agent, or Firm — Michael Best & Friedrich LLP

(57) ABSTRACT

Provided is a semiconductor super junction power device. The semiconductor super junction power device includes an MOSFET cell array composed of multiple super junction MOSFET cells. Each of multiple MOSFET cells includes a p-type body region located at the top of an n-type drift region, a p-type columnar doping region located below the
(Continued)

p-type body region, an n-type source region located in the p-type body region, a gate dielectric layer located above the p-type body region, a gate electrode located above the p-type body region, an n-type floating gate located above the p-type body region and an opening located in the gate dielectric layer, where in a lateral direction, the gate electrode is located on one side close to the n-type source region; an opening located in the gate dielectric layer, where the n-type floating gate contacts the p-type body region through the opening to form a p-n junction diode.

5 Claims, 2 Drawing Sheets

(51) Int. Cl.
    *H01L 29/88*        (2006.01)
    *H01L 29/78*        (2006.01)
    *H01L 29/788*       (2006.01)
(58) Field of Classification Search
    CPC ............ H01L 29/7802; H01L 29/7889; H01L 27/0629; H01L 27/0727
    See application file for complete search history.

(56) References Cited

U.S. PATENT DOCUMENTS

| | | | | |
|---|---|---|---|---|
| 2017/0179115 | A1* | 6/2017 | Wang | .................. H01L 29/7786 |
| 2020/0091335 | A1* | 3/2020 | Ono | ..................... H01L 29/0878 |

FOREIGN PATENT DOCUMENTS

| | | | | |
|---|---|---|---|---|
| CN | 103367157 | | 10/2013 | |
| CN | 103887313 | * | 3/2014 | ....... H01L 29/42324 |
| CN | 103887313 | | 6/2014 | |
| CN | 104465381 | | 3/2015 | |

OTHER PUBLICATIONS

PCT/CN2019/123313 International Search Report dated Aug. 20, 2020.

\* cited by examiner

SEMICONDUCTOR SUPER-JUNCTION POWER DEVICE

CROSS-REFERENCE TO RELATED APPLICATIONS

This is a National Stage Application filed under 35 U.S.C. 371 based on International Patent Application No. PCT/CN2019/123313, filed on Dec. 5, 2019, which claims priority to Chinese Patent Application No. 201911184048.1 filed on Nov. 27, 2019, the disclosures of both of which are incorporated herein by reference in their entireties.

TECHNICAL FIELD

The present application belongs to the technical field of semiconductor super junction power devices, for example, a semiconductor super junction power device with a fast reverse recovery speed.

BACKGROUND

FIG. 1 is an equivalent circuit of a semiconductor super junction power device in the related art. The semiconductor super junction power device includes a source electrode 101, a drain electrode 102, a gate electrode 103 and a body diode 104. The body diode 104 is an intrinsic parasitic structure in the semiconductor super junction power device. In the related art, the operating mechanism of the semiconductor super junction power device is as follows: 1) when a gate-source voltage Vgs is less than a threshold voltage Vth of the semiconductor super junction power device and a drain-source voltage Vds is greater than 0 V, the semiconductor super junction power device is in an off state; 2) when the gate-source voltage Vgs is greater than the threshold voltage Vth of the semiconductor super junction power device and the drain-source voltage Vds is greater than 0 V, the semiconductor super junction power device is turned on forward, and a current flows from the drain electrode to the source electrode through a current channel at the gate electrode. In the related art, if the semiconductor super junction power device is turned off, when the drain-source voltage Vds is less than 0 V, a body diode of the semiconductor super electrode power device is in a positive bias state, a reverse current flows from the source electrode to the drain electrode through the body diode. In this case, the current in the body diode injects minority carriers, and these minority carriers perform reverse recovery when the semiconductor super junction power device turns on again, causing a relatively large reverse recovery current and long reverse recovery time.

SUMMARY

The present application provides a semiconductor super junction power device with a fast reverse recovery speed, so as to solve the technical problem of long reverse recovery time caused by the minority carrier injection problem of a semiconductor super junction power device in the related art.

An embodiment of the present disclosure provides a semiconductor super junction power device. The device includes an n-type drain region, an n-type drift region located above the n-type drain region and a super junction metal-oxide-semiconductor field effect transistor (MOSFET) cell array composed of multiple super junction MOSFET cells.

Each of the multiple super junction MOSFET cells includes a p-type body region, a p-type columnar doping region located below the p-type body region, an n-type source region located in the p-type body region, a gate structure located above the p-type body region and an opening in the gate dielectric layer. The p-type body region is located at the top of the n-type drift region. The gate structure includes a gate dielectric layer, a gate electrode and an n-type floating gate, the gate electrode and the n-type floating gate are located above the gate dielectric layer, and in a lateral direction, the gate electrode is located on one side close to the n-type source region, the n-type floating gate is located on one side close to the n-type drift region, and the gate electrode acts on the n-type floating gate through capacitive coupling. The n-type floating gate contacts the p-type body region through the opening to form a p-n junction diode.

In an implementation, in the semiconductor super junction power device of the present application, the gate electrode extends above the n-type floating gate.

In an implementation, in the semiconductor super junction power device of the present application, the gate electrode extends above the n-type floating gate and covers a sidewall of the n-type floating gate close to the n-type drift region.

In an implementation, in the semiconductor super junction power device of the present application, the opening is located below the n-type floating gate and on one side close to the n-type drift region.

In an implementation, in the semiconductor super junction power device of the present application, in the super junction MOSFET cell array, a gate electrode of at least one super junction MOSFET cell is electrically connected to the n-type source region.

According to the embodiment of the present disclosure, when the semiconductor super junction power device is in a forward blocking state and a forward on state, the semiconductor super junction power device has a high threshold voltage; and when the semiconductor super junction power device is reverse-conducting, each super junction MOSFET cell has a low threshold voltage, and thereby, the each super junction MOSFET cell is turned on at a low gate voltage (or a voltage of 0 V). This can increase the reverse current flowing through the each super junction MOSFET cell, reduce the current flowing through a body diode parasitic in the semiconductor super junction power device, and improve the reverse recovery speed of the semiconductor super junction power device.

BRIEF DESCRIPTION OF DRAWINGS

Drawings used in the embodiments are briefly described hereinafter.

DETAILED DESCRIPTION

Figure 1:
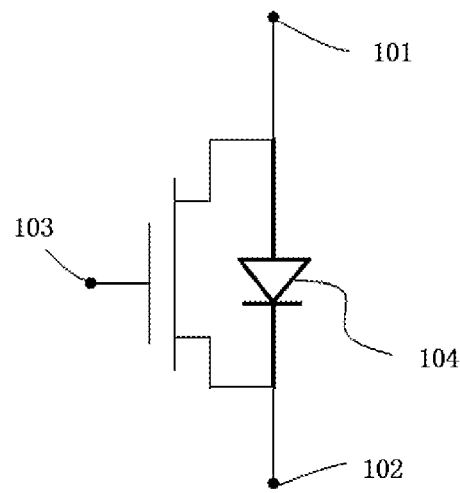
FIG. 1 is an equivalent circuit diagram of a semiconductor super junction power device in the related art.

The solution of the present application is described hereinafter through specific implementations in conjunction with the drawings in the embodiments of the present disclosure.

Meanwhile, in the schematic diagrams illustrated in the drawings of the specification, the sizes of layers and regions described in the present application are enlarged, and the sizes illustrated in the drawings do not represent the actual sizes. The embodiments described in the specification are not intended to limit the regions shown in the drawings to specific shapes, but include obtained shapes, for example, deviations due to manufacturing.

Figure 2:
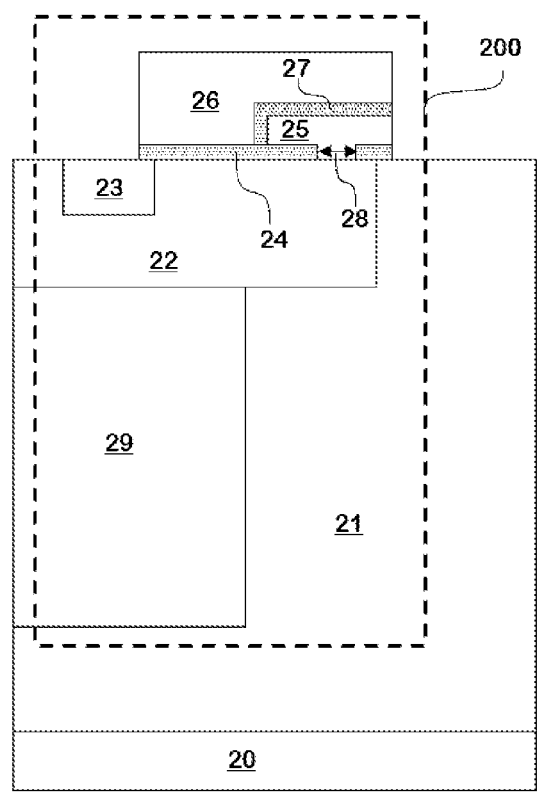
FIG. 2 is a sectional view of a first embodiment of a semiconductor super junction power device according to the present application.

FIG. 2 is a sectional view of a first embodiment of a semiconductor super junction power device according to the present application. As shown in FIG. 2, an semiconductor super junction power device provided by the embodiment of the present disclosure includes an n-type drain region 20, an n-type drift region 21 located above the n-type drain region 20 and a super junction metal-oxide-semiconductor field effect transistor (MOSFET) cell array composed of multiple super junction MOSFET cells 200. Merely one super junction MOSFET cell 200 is shown illustratively in FIG. 2.

The MOSFET cell 200 of the embodiment of the present disclosure includes a p-type body region 22, a p-type columnar doping region 29 located below the p-type body region 22, an n-type source region 23 located in the p-type body region 22 and a gate structure located above the p-type body region 22. The p-type body region 22 is located at the top of the n-type drift region 21, and the charge balance is formed between the p-type columnar doping region 29 and the n-type drift region 21 adjacent to the p-type columnar doping region 29 to improve the withstand voltage of the semiconductor super junction power device. The gate structure includes a gate dielectric layer 24, an n-type floating gate 25 and a gate electrode 26. The gate electrode 26 and the n-type floating gate 25 are located above the gate dielectric layer 24, and in a lateral direction, the gate electrode 26 is located on one side close to the n-type source region 23, and the n-type floating gate 25 is located on one side close to the n-type drift region 21. The gate electrode 26 and the n-type floating gate 25 are isolated by an insulating dielectric layer 27, and the gate electrode 26 acts on the n-type floating gate 25 through capacitive coupling. The insulating dielectric layer 27 is generally silicon dioxide.

In the semiconductor super-junction power device according to the embodiment of the present disclosure, in the lateral direction, the n-type floating gate 25 is located above the gate dielectric layer 24 and on one side close to the n-type drift region 21, that is, the n-type floating gate 25 is disposed close to the n-type drift region 21, and the gate electrode 26 may be located above the gate dielectric layer 24 and on one side close to the n-type source region 23, that is, the gate electrode 26 is merely located on the side of the n-type floating gate 25 close to the n-type source region 23; and the gate electrode 26 may also be partially located on the side of the n-type floating gate 25 close to the n-type source region 23, and the other portion of the gate electrode 26 extends above the n-type floating gate 25 (as shown in FIG. 2). The gate electrode 26 extends to one side of the n-type drift region 21 above the n-type floating gate 25, which can increase the area of the n-type floating gate 25 covered by the gate electrode 26, and further can increase the capacitive coupling ratio of the gate electrode 26 to the n-type floating gate 25.

The opening 28 is formed in the gate dielectric layer 24. The n-type floating gate 25 contacts the p-type body region 22 through the opening 28 in the gate dielectric layer 24 to form the p-n junction diode.

In this embodiment of the present disclosure, when the semiconductor super junction power device is in a forward blocking state, the n-type drain region 20 is applied with a high voltage, the p-n junction diode formed by the n-type floating gate 25 in contact with the p-type body region 22 is forward biased, and the n-type floating gate 25 is charged with a positive charge, so that the threshold voltage Vht1 of the current channel under the n-type floating gate 25 is reduced. In an embodiment, the opening 28 is located below the n-type floating gate 25 and on one side close to the n-type drift region 21, that is, in the lateral direction, the distance from the center of the opening 28 to one side end of the gate dielectric layer 24 close to the n-type drift region 21 is less than the distance from the center of the opening 28 to one side end of the gate dielectric layer 24 close to the n-type source region 23, so that the opening 28 is disposed closer to the n-type drift region 21 in the gate dielectric layer 24, which makes it easier for the n-type floating gate 25 to be charged with the positive charge, thereby increasing the voltage of the n-type floating gate 25 and reducing the threshold voltage Vht1 of the current channel under the n-type floating gate 25.

In this embodiment of the present disclosure, when the semiconductor super junction power device is in a forward blocking state and a forward turning-on state, the drain-source voltage Vds is greater than 0 V, the threshold voltage Vht1 of the current channel under the n-type floating gate 25 has little influence on the threshold voltage Vth of the entire super junction MOSFET cell, and the semiconductor super junction power device still has a high threshold voltage. In this embodiment of the present disclosure, if the semiconductor super junction power device is turned off, when the source-drain voltage Vsd is greater than 0 V, the threshold voltage Vht1 of the current channel under the n-type floating gate 25 has a great influence on the threshold voltage Vth of the entire super junction MOSFET cell, so the super junction MOSFET cell has a low threshold voltage Vth, and thereby, the super junction MOSFET cell is turned on at a low gate voltage (or a voltage of 0 V). This can increase the current flowing through the super junction MOSFET cell, reduce the current flowing through a body diode parasitic in the semiconductor super junction power device, and improve the reverse recovery speed of the semiconductor super junction power device.

In the MOSFET cell array of the semiconductor super junction power device of the embodiment of the present disclosure, the gate electrode 26 of at least one super junction MOSFET cell 200 can be electrically connected to the n-type source region 23, that is, this part of the gate electrodes 26 are connected to the source voltage, which can reduce the gate charge of the semiconductor super junction power device.

Figure 3:
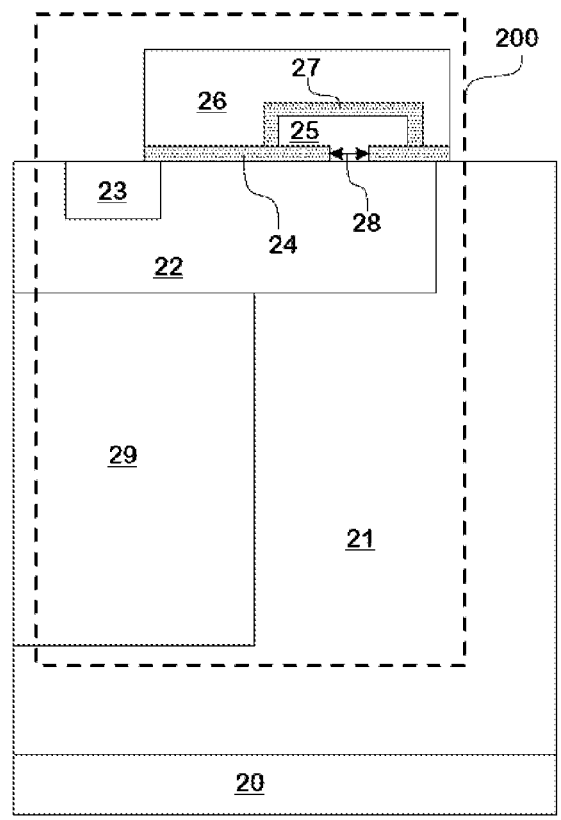
FIG. 3 is a sectional view of a second embodiment of a semiconductor super junction power device according to the present application.

FIG. 3 is a sectional view of a second embodiment of a semiconductor super junction power device according to the present application. As shown in FIG. 3, this embodiment is different from the structure of the semiconductor super junction power device of the first embodiment of the present application shown in FIG. 2, the gate electrode 26 in this embodiment extends to one side of the n-type drift region 21 above the n-type floating gate 25 and covers a sidewall of the n-type floating gate 25 close to the n-type drift region 21. This can increase the area of the n-type floating gate 25 covered by the gate electrode 26, and further can increase the capacitive coupling rate of the gate electrode 26 to the n-type floating gate 25.

What is claimed is:

1. A semiconductor super junction power device, comprising:
   an n-type drain region, an n-type drift region located above the n-type drain region and a super junction MOSFET cell array composed of a plurality of super junction MOSFET cells, wherein each super junction MOSFET cell of the plurality of super junction MOSFET cells comprises:

a p-type body region, located at a top of the n-type drift region;

a p-type columnar doping region, located below the p-type body region;

an n-type source region, located in the p-type body region;

a gate structure located above the p-type body region, wherein the gate structure comprises a gate dielectric layer, a gate electrode and an n-type floating gate, the gate electrode and the n-type floating gate are located above the gate dielectric layer, and in a lateral direction, the gate electrode is located on a side close to the n-type source region, the n-type floating gate is located on a side close to the n-type drift region, and the gate electrode is configured to act on the n-type floating gate through capacitive coupling; and an opening located in the gate dielectric layer, wherein the n-type floating gate contacts the p-type body region through the opening to form a p-n junction diode.

2. The semiconductor super junction power device of claim 1, wherein the gate electrode extends to be above the n-type floating gate.

3. The semiconductor super junction power device of claim 1, wherein the gate electrode extends to be above the n-type floating gate and covers a sidewall of the n-type floating gate close to the n-type drift region.

4. The semiconductor super junction power device of claim 1, wherein the opening is located below the n-type floating gate and on a side of the n-type floating gate close to the n-type drift region.

5. The semiconductor super junction power device of claim 1, wherein in the super junction MOSFET cell array, a gate electrode of at least one super junction MOSFET cell of the plurality of super junction MOSFET cells is electrically connected to the n-type source region.

* * * * *